United States Patent [19]

Uehara

[11] Patent Number: 4,498,742
[45] Date of Patent: Feb. 12, 1985

[54] ILLUMINATION OPTICAL ARRANGEMENT

[75] Inventor: Makoto Uehara, Tokyo, Japan

[73] Assignee: Nippon Kogaku K.K., Tokyo, Japan

[21] Appl. No.: 416,029

[22] Filed: Sep. 8, 1982

[30] Foreign Application Priority Data

Sep. 10, 1981 [JP] Japan ............................... 56-141677
Mar. 18, 1982 [JP] Japan ................................ 57-43395

[51] Int. Cl.$^3$ .............................................. G02B 21/06
[52] U.S. Cl. .................................... 350/523; 350/432
[58] Field of Search ................ 350/523, 525, 432, 423

[56] References Cited

U.S. PATENT DOCUMENTS 3,064,523 11/1962 Meltzer ........................... 350/525 X
3,296,923 1/1967 Miles ..................................... 353/38
3,547,526 12/1970 Devereux ....................... 350/432 X
4,159,864 7/1979 Yasukuni et al. ................... 350/423

OTHER PUBLICATIONS

McLeod, "The Axicon: A New Type of Optical Element", Journal of the Optical Society of America, vol. 44, No. 8, pp. 592–597, 8-1954.

Primary Examiner—John K. Corbin
Assistant Examiner—Lynn Vandenburgh Kent
Attorney, Agent, or Firm—Shapiro and Shapiro

[57] ABSTRACT

Disclosed is an illumination optical arrangement including light source means for supplying a substantially collimated light beam, and optical means for shifting the collimated light beam from the light source means toward the central axis of the light beam. The optical means includes an entrance surface axis-symmetrically disposed with a predetermined inclination with respect to the central axis to cause the collimated light beam to be refracted toward the central axis substantially at the same angle, and an exit surface axis-symmetrically disposed with said predetermined inclination with respect to the central axis to cause the light beam from the entrance surface to be refracted in a direction parallel to the central axis.

9 Claims, 9 Drawing Figures

ILLUMINATION OPTICAL ARRANGEMENT

BACKGROUND OF THE INVENTION

1. Field of the Invention

This invention relates to an illumination optical arrangement, and more particularly to an illumination optical arrangement for illuminating a specimen in a microscope or for a device for projecting onto a semiconductor substrate a pattern on a reticle in the field of a semiconductor manufacturing apparatus.

2. Description of the Prior Art

In an illumination optical arrangement using a discharge type light source such as a super-high pressure mercury lamp, it is most efficient to condense light by a concave reflecting mirror such as an elliptical reflecting mirror, but this produces an illumination light beam in which light is absent near the optical axis and the central portion of the beam is hollow. Accordingly, if such illumination system is used in a microscope or the like wherein illumination is effected as transmitted light relative to an object and imaging is effected by an objective lens, the illumination has an annular distribution and light is absent at the center of the beam passing through the entrance pupil of the objective lens. The result is that only a marginal light beam is passed through the objective lens, so that aberration is a problem, and this is not desirable.

Also, where the numerical aperture (N.A.) of the illumination light is prescribed corresponding to the numerical aperture (N.A.) of the objective lens, there has been the disadvantage that the absolute quantity of light is less because light is absent at the center of the light beam.

Usually, when illumination N.A./objective N.A. = $\sigma$, if the illumination N.A. is set so that $\sigma$ is a value more or less smaller than 1, both depth of field and resolution of the objective lens will be at their best. In the illumination system of this type, it is necessary to place a stop in an annular portion having a great quantity of light in order to restrict the N.A. of the illumination light beam, and the quantity of light effectively used decreases. For example, a collimating lens of a short focal length may be used so as to be coincident with the set $\sigma$. However, the actual light source is not a point source of light but has a finite size and therefore, if the focal length is short, the light beam which should become parallel rearwardly of the collimating lens will have an angle relative to the optical axis and will be intercepted by a stop and thus, a great quantity of light will be wasted.

SUMMARY OF THE INVENTION

It is a primary object of the present invention to provide an illumination optical arrangement which obtains a high illumination efficiency by improving the distribution of quantity of light.

The arrangement of the present invention includes light source means for supplying a substantially collimated light beam, and optical means for shifting the collimated light beam from the light source means toward the central axis of the light beam. The optical means has a light entrance surface formed by a conical convex surface and an exit surface formed by a conical concave surface having an apex angle substantially equal to that of the cone of the entrance surface. The cones of the entrance surface and exit surface have their apexes lying on the central axis of the said light beam, and include a prism whose lead lines lie on planes parallel to each other.

The prism may be formed by a single prism block or may be formed by at least two prism blocks, i.e., a block including an entrance surface and a block including an exit surface.

According to the arrangement of the present invention, there is obtained a suitable illumination light beam in which the annular distribution of quantity of light is corrected with respect to a collimated light beam obtained from a condensing mirror having, for example, a quadratic cross-section.

According to a preferred embodiment of the present invention, there is provided a projection illumination optical arrangement which is capable of varying the $\sigma$ value, namely, the size of an aperture stop formed in the entrance pupil of the projection objective lens relative to the diameter of the entrance pupil, without causing any loss of quantity of light.

The invention will become more fully apparent from the following detailed description thereof taken in conjunction with the accompanying drawings.

DESCRIPTION OF THE PREFERRED EMBODIMENTS

Some embodiments of the present invention will hereinafter be described in detail with reference to the drawings.

Figure 1:
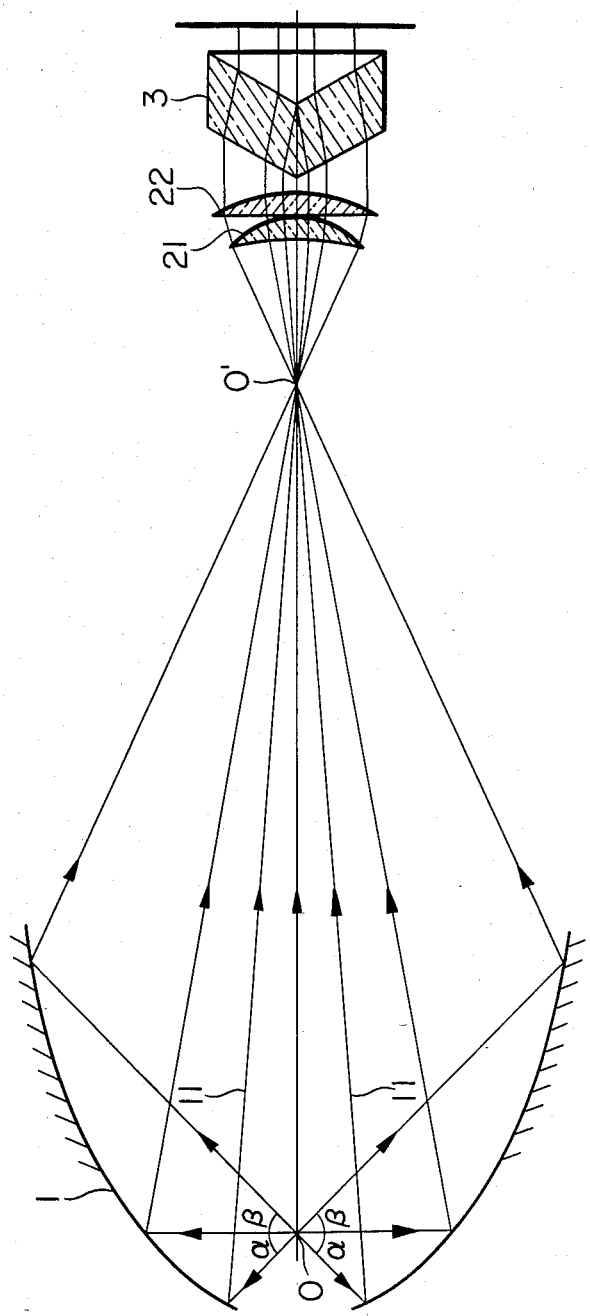
FIG. 1 is a schematic cross-sectional view showing an illumination optical system according to an embodiment of the present invention.

FIG. 1 shows the optical system of a device according to an embodiment of the present invention. When a light source is provided on one focus O of an elliptical mirror 1, light is condensed on the other focus O' of the elliptical mirror 1. This light beam is made afocal by a collimating lens system 21, 22. A prism 3 having its first and second surfaces made conical is provided rearwardly of the collimating lens system. This prism 3 has a so-called meniscus configuration in which the entrance surface for the light beam from the light source is formed into a conical convex surface and the exit surface is formed into a conical concave surface having a vertical angle equal to that of the cone of the entrance surface, and is so disposed that each vertex thereof is coincident with the optical axis of the collimating lens system 21, 22. Accordingly, the collimated light beam having left the collimating lens system 21, 22 is refracted in the direction of the optical axis on the entrance surface of the prism 3, and is again refracted on the exit surface so as to become a collimated light beam, as a result of which it is shifted in the direction in which it approaches the optical axis.

Figure 2:
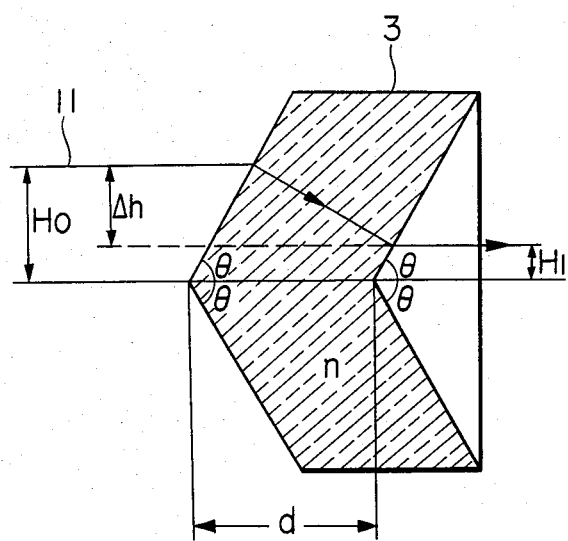
FIG. 2 is a cross-sectional view showing the details of the prism 3 of FIG. 1.
Figure 4:
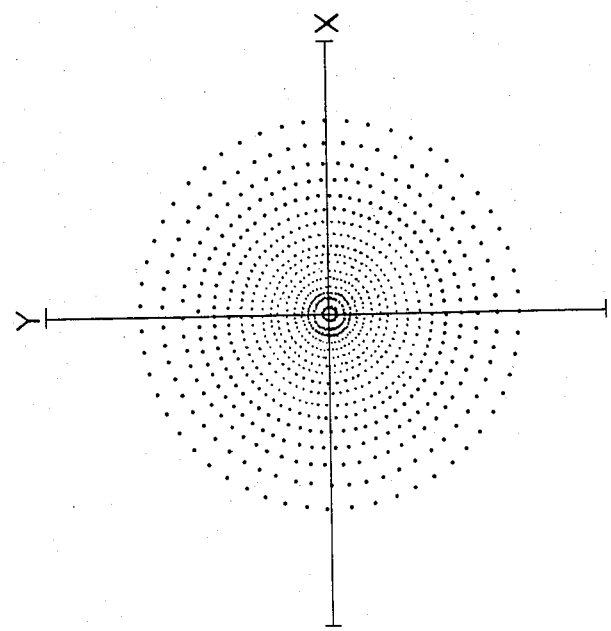
FIG. 4 is a spot diagram showing the distribution of the quantity of light of a light beam exiting from the prism 3 of FIG. 1.
Figure 3:
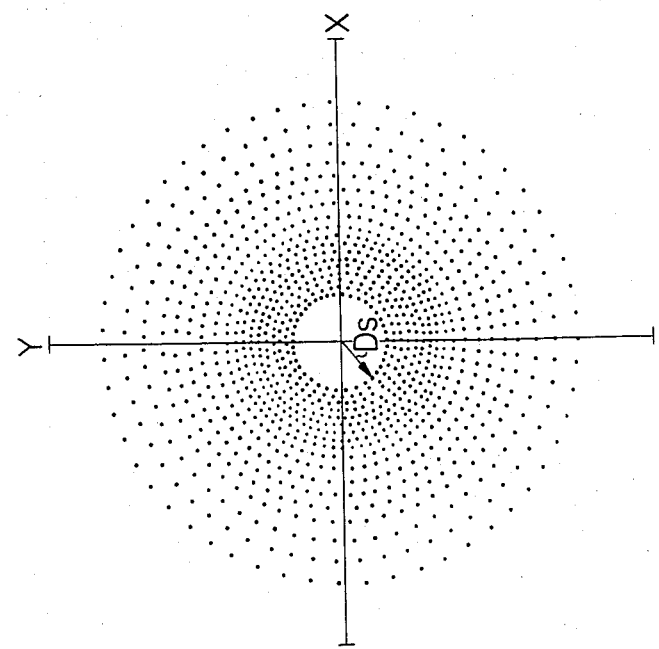
FIG. 3 is a spot diagram showing the distribution of the quantity of light of a light beam exiting from the collimating lenses 21, 22 of FIG. 1.

Assuming that light is cubically uniformly radiated from the light source on the focus O in a range of $\alpha=\beta=45°$ and the light source itself is an ideal point source of light, a light ray 11 emitted from the point source of light passes through the collimating lens system 21, 22 as a light ray nearest to the optical axis due to the inner diaphragm of the elliptical mirror 1 and to the directionality of the light source, whereafter it becomes a light ray spaced apart by a distance $H_o$ from the optical axis and parallel to the optical axis as shown in detail in FIG. 2. A spot diagram of this collimated light beam is shown in FIG. 3, wherein a circular eclipse having a radius $D_s=H_o$ is created around the optical axis. The prism 3 shifts this light ray 11 by $H_o=\Delta h$ toward the optical axis and makes it coincident with the optical axis (that is, makes it into $H_o=\Delta h$). A spot diagram of this shifted collimated light beam is shown in FIG. 4. Thus, in the case of an ideal point source of light, a collimated light beam quite free of eclipse can be created.

Generally, however, a light source has a finite size and light rays entering the prism 3 behind the collimating lens system 21, 22 are not always parallel to the optical axis.

Certainly, in the case of a point source of light, it is desirable that $$\Delta h = H_o,$$

but since the light source has a finite size, it is desirable that $$\tfrac{1}{2}H_o \leqq \Delta h \leqq 2H_o \qquad (1).$$

Considering only a light beam parallel to the optical axis, under-correction occurs in the left side and over-correction occurs in the right side, but in a light source having a finite size, the eclipse around the optical axis is eliminated good illumination light is obtained.

In formula (1), if $\Delta h$ is expressed by the vertical angle $2\theta$, the refractive index n and the center thickness d of the prism 3, $$\Delta h = d \tan((\pi/2) - \sin^{-1}(\cos\theta/n) - \theta).$$

In a case where the light from the light source is condensed by a quadratic surface mirror such as a parabolic surface mirror instead of the elliptical mirror employed in this embodiment, the present invention is also applicable. For example, in a parabolic surface mirror, if a point source of light is placed on the focus, the light becomes a collimated light beam (afocal system) and a circular eclipse having a radius $D_s$ is created around the optical axis corresponding to a central opening portion. Accordingly, again in this case, the configuration of the prism 3 may be made as follows from the relation of the eclipse radius $D_s$.

$$\tfrac{1}{2}D_s \leqq d\cdot\tan(\pi/2 - \sin^{-1}(\cos\theta/n) - \theta) \leqq 2D_s \qquad (2)$$

The prism 3 of the present invention is not restricted to the above-described embodiment, but even if it is divided into two prisms, it will have a similar effect if there are a cone as a convexity and a cone as a concavity, and if the length of the optical path passing through the prism is shortened by so dividing the prism, a greater advantage will of course be brought about in terms of transmission factor.

Figure 5:
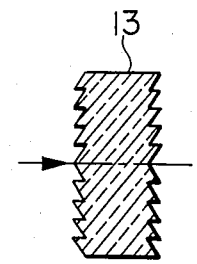
FIG. 5 is a cross-sectional view showing a modification of the prism.

Further, an equivalent effect can also be obtained by forming the prism 3 into a Fresnel type 13 as shown in FIG. 5.

Figure 6:
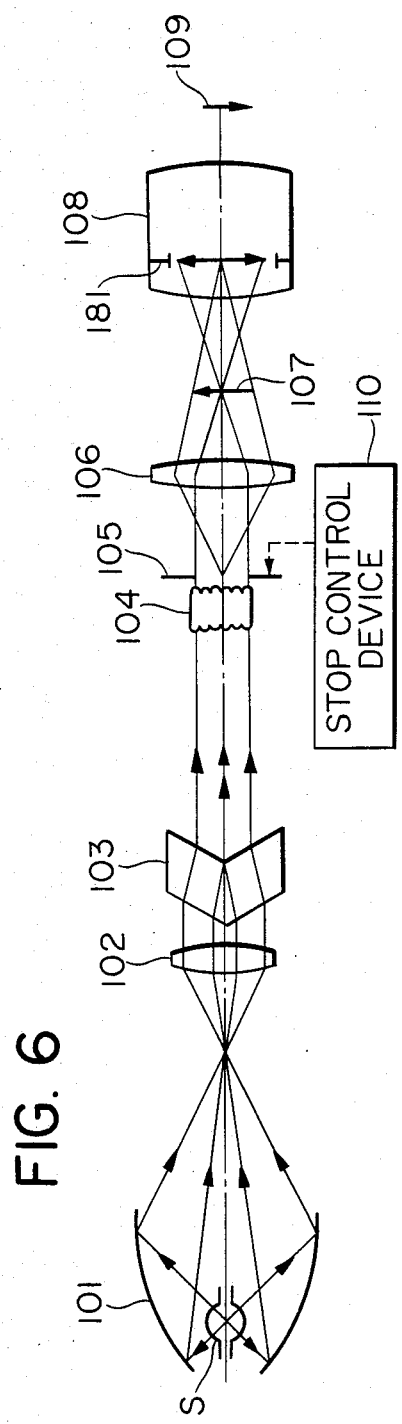
FIG. 6 is a schematic view showing an embodiment of a projection exposure device having the illumination optical system of the present invention.

FIG. 6 shows an embodiment suitable as the illumination device of a projection exposure device for projecting a pattern on a reticle onto a semiconductor substrate by the use of the illumination optical system of FIG. 1.

Figure 8A:
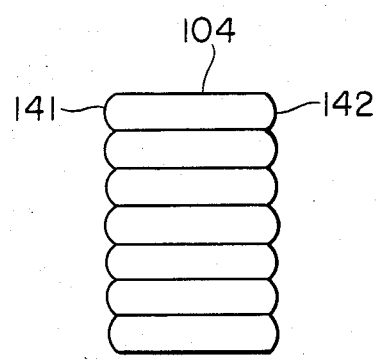
FIG. 8A is a longitudinal cross-sectional view of an optical integrator.
Figure 8B:
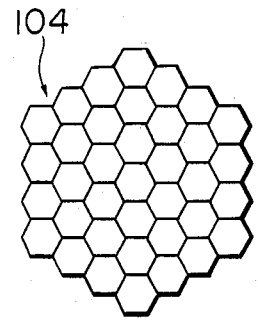
FIG. 8B is a transverse cross-sectional view of the optical integrator.

The light from a light source S is condensed by an elliptical mirror 10 and passes through a collimating lens 102 and a prism 103 and exits as a collimated light beam in which the eclipse around the optical axis has been corrected. The above-described elements are substantially identical to those in the embodiment of FIG. 1. The light beam from the prism 103 reaches an optical integrator 104. The optical integrator 104, as shown in FIGS. 8A and 8B, comprises hexagonal glass posts each having the opposite ends thereof worked into convex lenses and bundled in the form of a honey-comb. Front small lenses 141 and rear small lenses 142 have substantially equal refractive powers, and the spacing therebetween is equal to the rear focal length of the front small lenses 141 as well as to the front focal length of the rear small lenses 142. The front small lenses 141 and the rear small lenses 142 are in one-to-one correspondence, and the rear small lenses 142 serve to cause the images of the front small lenses 141 corresponding thereto to be formed on the object plane. Therefore, the shape of the apertures of the front small lenses 141 is similar to the shape of the illumination area on the object plane and, since the shape of the individual small lenses is hexagonal, the shape of the illumination area is also hexagonal. Such an optical integrator may be formed by two lenticular lens plates as is shown in U.S. Pat. No. 3,296,923 issued on Jan. 10, 1967. An aperture stop 105 is provided near the exit surface of the optical integrator, and the light beam having passed through the aperture stop 105 passes through a condenser lens 106 and illuminates a reticle 107 as a negative to be projected. The reticle 107 is projected onto a wafer 109 at a predetermined magnification by a projection objective lens 108. The aperture stop 105 and the entrance pupil 181 of the projection objective lens 108 are conjugate with respect to the condenser lens 106 and so-called Koehler illumination is effected. When the aperture of the entrance pupil of the projection objective lens 108 is $\phi e$ and the size of the image of the aperture stop 105 formed thereat is $\phi a$, the $\sigma$ (sigma) value is represented by $\sigma = \phi a/\phi e$. Generally, the $\sigma$ value is often selected to a value in the range 0.5–0.7, which is smaller than 1, and the greater is this value, the worse is the resolution in fine patterns and the shallower is the depth of focus; however image deformation by the interference between fine patterns is less likely to occur. Conversely, if the value of $\sigma$ becomes smaller, both the resolution and the depth of focus become better but the image deformation becomes more likely to occur. Considering the exposure efficiency of the projection objective lens, it is more advantageous to select a great $\sigma$ value if the intensity of illumination at the entrance pupil is constant. It is known that great and small sigma values produce opposite effects, as shown in Table 1 below.

TABLE 1

|  | σ is great | σ is small |
|---|---|---|
| Resolution and depth | Bad | Good |
| Deformation of image | Good | Bad |
| Exposure efficiency | Good | Bad |

It becomes possible in the present embodiment to change the σ value by changing the size of the aperture stop 105 by a stop control device 110 of known configuration and therefore, an optimum σ value can be obtained corresponding to the size of the reticle and the density of the patterns.

In the embodiment of FIG. 6, when the aperture of the aperture stop 105 is reduced from D to β·D, the light around the light beam from the optical integrator 104 is intercepted by the aperture stop 105, whereby the σ value is reduced β times. Accordingly, to make the σ value small, a loss of quantity of light in the aperture stop is unavoidable. To overcome this disadvantage, in the embodiment of FIG. 7, an afocal magnification changing system 200 including a positive lens $L_1$ and a negative lens $L_2$ is inserted between the prism 103 and the optical integrator 104. This afocal system 200 is controlled by a driving device 210 which responds to the control of the aperture stop by the stop control device 110 so that the magnification of the afocal system 200 becomes substantially equal to the reduction magnification β of the aperture stop 105, whereby almost all of the uniform light beam having left the prism 103 passes through the aperture stop 105 and thus, a very good efficiency can be obtained without any loss of quantity of light. It is important that the afocal system 200 is disposed rearwardly of the prism 103 (on the emergent light side). If the afocal system is disposed in reversed order, the hollow state of the hollow light beam from the collimating lens 102 is changed by the magnification of the afocal system and therefore, the illumination light cannot be efficiently supplied unless the amount of shift of the light beam toward the center by the prism is varied.

Figure 7:
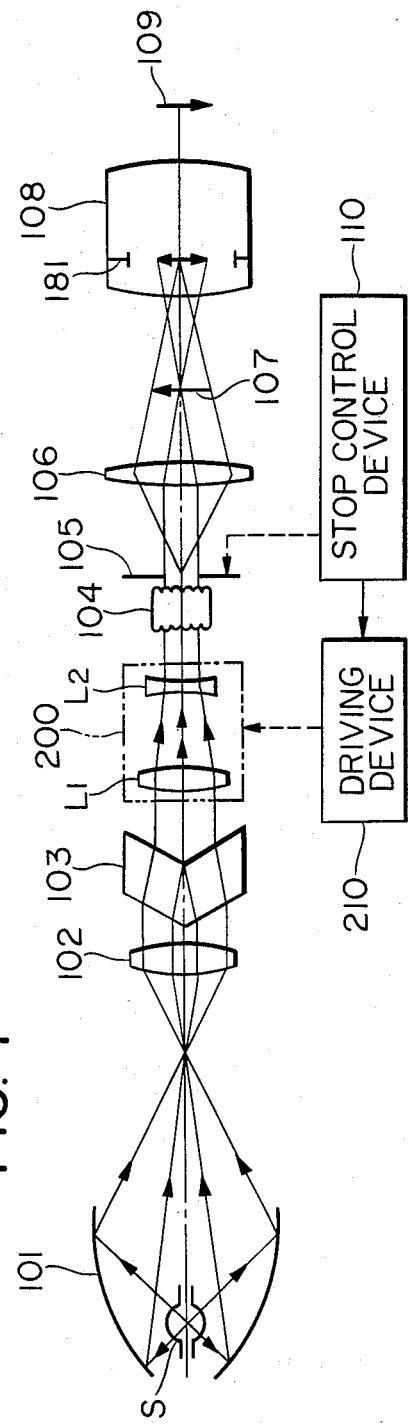
FIG. 7 is a schematic view showing another embodiment of a projection exposure device.

In the embodiment of FIG. 7, the magnification change of the afocal system is applicable not only to a reduction in aperture of the aperture stop 105 but also to a case where the diameter of the light beam is to be enlarged by making the aperture of the aperture stop greater to thereby increase the σ value to the order of 1. Further, instead of using an afocal system capable of changing the magnification thereof, the afocal system may be replaced by an afocal system different in magnification corresponding to the variation in the aperture stop. The afocal system is not restricted to the Galileo type comprising positive and negative lenses, but may also be of the Kepler type comprising two positive lenses.

The shape of the aperture stop is not restricted to a circular shape but may be elliptical or rectangular depending on the pattern of the reticle, and a toric lens system may be used as the afocal system to make the cross-sectional shape of the light beam non-isotropic. For example, as a toric lens system, a Galileo type afocal system may be constituted in one meridional plane and a Kepler type afocal system may be constituted in a meridional plane orthogonal thereto, and the shape of the light beam may be made substantially coincident with an aperture stop of non-isotropic shape.

I claim:
1. An illumination optical arrangement comprising:
   (a) light source means for supplying a substantially collimated light beam; and
   (b) optical means for shifting the collimated light beam from said light source means toward the central axis of said light beam, said optical means including an entrance surface axis-symmetrically disposed with a predetermined inclination with respect to said central axis to cause said collimated light beam to be refracted toward said central axis substantially at the same angle, and an exit surface axis-symmetrically disposed with said predetermined inclination with respect to said central axis to cause the light beam from said entrance surface to be refracted in a direction parallel to said central axis,
   wherein said optical means includes a prism having said entrance surface and exit surface, said entrance surface is formed by a conical convex surface, said exit surface is formed by a conical concave surface, and the cones of said entrance surface and exit surface have their apexes lying on said central axis, and wherein said light source means supplies a collimated light beam having an annular distribution of quantity of light having a circular dark area of radius $D_s$ around said central axis, and said prism is formed so as to satisfy the following condition:

$$(D_s/2) \leq d \tan((\pi/2) - \sin^{-1}(\cos\theta/n) - \theta) \leq 2D_s,$$

where the apexes of the cones are represented by $2\theta$, the refractive index is represented by n, and the distance between the apexes of the cones of the entrance surface and exit surface is represented by d.

2. An illumination optical arrangement according to claim 1, wherein said light source means includes a reflecting mirror whose cross-section along a plane containing said central axis of said light beam is represented by a quadratic curve, and a light source disposed on the focus of said reflecting mirror.

3. An illumination optical arrangement according to claim 2, wherein said cross-section of said reflecting mirror is represented by a part of an ellipse, said light source is disposed on one focus of said ellipse, and said light source means further includes lens means disposed between the other focus of said ellipse and said optical means to make into a collimated light beam the light beam from said light source reflected by said reflecting mirror.

4. An illumination optical arrangement comprising:
   (a) light source means for supplying a substantially collimated light beam;
   (b) optical means for shifting the collimated light beam from said light source means toward the central axis of said light beam, said optical means including an entrance surface axis-symmetrically disposed with a predetermined inclination with respect to said central axis to cause said collimated light beam to be refracted toward said central axis substantially at the same angle, and an exit surface axis-symmetrically disposed with said predetermined inclination with respect to said central axis to cause the light beam from said entrance surface to be refracted in a direction parallel to said central axis;

(c) stop means having a stop aperture through which the collimated light beam from said optical means passes, the diameter of said stop aperture being variable; and (d) afocal magnification changing optical means disposed between said optical means and said stop means and capable of varying the diameter of the collimated light beam reaching said stop means in accordance with the variation in the aperture diameter of said stop means.

5. An illumination optical arrangement according to claim 4, wherein said afocal magnification changing optical means has a magnification substantially equal to the diameter of said stop aperture relative to the diameter of the collimated light beam from said optical means.

6. An illumination optical arrangement according to claim 4, further comprising:

means for controlling the diameter of the stop aperture of said stop means; and drive means for magnification-change-operating said afocal magnification changing optical means in response to said control means.

7. An illumination optical arrangement according to claim 4, wherein said optical means includes a prism having said entrance surface and exit surface, said entrance surface is formed by a conical convex surface, said exit suface is formed by a conical concave surface, and the cones of said entrance surface and exit surface have their apexes lying on said central axis.

8. An illumination optical arrangement according to claim 4, wherein said light source means includes a reflecting mirror whose cross-section along a plane containing said central axis of said light beam is represented by a quadratic curve, and a light source disposed on the focus of said reflecting mirror.

9. An illumination optical arrangement according to claim 8, wherein said cross-section of said reflecting mirror is represented by a part of an ellipse, said light source is disposed on one focus of said ellipse, and said light source means further includes lens means disposed between the other focus of said ellipse and said optical means to make into a collimated light beam the light beam from said light source reflected by said reflecting mirror.

* * * * *